United States Patent
Veilleux, Jr.

(10) Patent No.: US 9,386,712 B2
(45) Date of Patent: Jul. 5, 2016

(54) HIGH-TEMPERATURE ENVIRONMENT ELECTRONIC CHASSIS

(71) Applicant: Hamilton Sundstrand Corporation, Charlotte, NC (US)

(72) Inventor: Leo J. Veilleux, Jr., Wethersfield, CT (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 163 days.

(21) Appl. No.: 14/192,096

(22) Filed: Feb. 27, 2014

(65) Prior Publication Data

US 2015/0124407 A1 May 7, 2015

Related U.S. Application Data

(60) Provisional application No. 61/900,734, filed on Nov. 6, 2013.

(51) Int. Cl.
*H05K 7/20* (2006.01)
*H05K 5/02* (2006.01)

(52) U.S. Cl.
CPC .......... *H05K 5/0213* (2013.01); *H05K 7/20263* (2013.01); *H05K 2007/20527* (2013.01)

(58) Field of Classification Search
CPC .......... H05K 5/0213; H05K 7/20427
See application file for complete search history.

(56) References Cited

U.S. PATENT DOCUMENTS

| | | | |
|---|---|---|---|
| 5,913,552 A | 6/1999 | McLellan et al. | |
| 6,049,469 A * | 4/2000 | Hood, III | G06F 1/182 174/388 |
| 6,735,450 B1 * | 5/2004 | Remmert | H04B 1/38 361/688 |
| 7,355,848 B1 * | 4/2008 | Hodge | H05K 7/20127 165/185 |
| 7,450,382 B1 * | 11/2008 | Fischer | H05K 7/20545 361/688 |
| 7,812,254 B2 * | 10/2010 | Wayman | H02G 3/081 174/50 |
| 2003/0042045 A1 | 3/2003 | Koskenmaki et al. | |
| 2003/0117776 A1 * | 6/2003 | Katsuro | H05K 7/20854 361/705 |
| 2007/0115635 A1 * | 5/2007 | Low | H05K 7/20 361/700 |
| 2011/0284189 A1 * | 11/2011 | Sinha | F02C 7/24 165/104.26 |
| 2012/0050957 A1 * | 3/2012 | Pruszenski | H05K 7/20127 361/679.01 |
| 2013/0258583 A1 | 10/2013 | Balk et al. | |
| 2014/0268604 A1 * | 9/2014 | Wicker | B29C 70/885 361/760 |
| 2014/0268607 A1 * | 9/2014 | Wicker | H05K 3/328 361/761 |

FOREIGN PATENT DOCUMENTS

| | | |
|---|---|---|
| DE | 3243495 A1 | 5/1984 |
| EP | 0080156 A1 | 6/1983 |
| GB | 2279364 A | 1/1995 |
| WO | 2004110951 A1 | 12/2004 |

OTHER PUBLICATIONS

GB Search Report for Applicaiton No. GB1417526.9, Mailed on Mar. 26, 2015, 5 pages.

* cited by examiner

*Primary Examiner* — Gregory Thompson
(74) *Attorney, Agent, or Firm* — Cantor Colburn LLP

(57) ABSTRACT

An electrical chassis for use in high temperature environments is disclosed. The electrical chassis may be employed, for example, in close proximity to the combustion chamber of a jet engine. The electrical chassis is constructed with a substrate formed from a material with low thermal conductivity and low electrical conductivity, such as polyetheretherketone. A reflective surface may be disposed on a housing containing the substrate to reduce the absorption of radiation. A heat sink and fluid inlet and outlet may also be arranged to remove heat generated by the electrical components.

10 Claims, 3 Drawing Sheets

US 9,386,712 B2

HIGH-TEMPERATURE ENVIRONMENT ELECTRONIC CHASSIS

CROSS-REFERENCE TO RELATED APPLICATIONS

This patent application claims priority to U.S. Provisional Application No. 61/900,734, filed Nov. 6, 2013, which is incorporated herein by reference in its entirety.

BACKGROUND

The present disclosure relates generally to electrical components for use in harsh environments and, more particularly, relates to electrical components for use in high-temperature environments such as a jet engine.

Electrical components in general require a substantial amount of cooling. Improper cooling of such components, especially those that are configured on circuit boards, can lead to performance issues, including malfunctions and failure. Consequently, there is a continual effort to improve the cooling of electrical components. This is usually accomplished by using one or both of conduction cooling, e.g., employing a heat sink, or by using convection cooling, e.g., air-cooling.

Electrical components deployed in high-temperature environments require special consideration. For example, cooling by conduction alone becomes impractical where the ambient temperature surrounding the housing containing the electrical components generates more heat than the electrical components themselves. Further, convection cooling may be inadequate for maintaining an acceptable temperature. This is especially true where the environment in which the electrical components reside makes proper insulation infeasible.

For example, engine core mounted electronics for aircraft require significant cooling to maintain required operating temperatures. This environment can generate enormous amounts of heat, particularly in the combustion and expansion areas of a jet engine. The use of cooling techniques is limited by space and weight constraints. For these reasons, the industry is receptive to improvements in electrical systems and components for harsh environments.

SUMMARY

Disclosed herein is an electrical system for use in a high-temperature environment. The electrical system comprises a number of electrical components arranged on a chassis and contained within a housing. A reflective layer is disposed on an outer surface of the housing. The chassis is comprised of the substrate material having properties of low thermal conductivity and low electrical conductivity.

Another aspect of the disclosure provides an electrical chassis disposed in an aircraft engine. A substrate formed from a thermally resistant polymer material has a number of electrical components arranged thereon. A heat sink is coupled to the substrate, the heat sink being cooled by a fluid. The substrate is arranged in or adjacent to the engine.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures. It is to be understood that other embodiments may be utilized and changes may be made without departing from the scope of the present disclosure. In particular, the disclosure provides various examples related to jet aircraft engines, whereas the advantages of the present disclosure as applied in a related field would be apparent to one having ordinary skill in the art and are considered to be within the scope of the present invention.

Electrical systems used in high-temperature environments present cooling issues that run counter to the vast majority of cooling solutions. In general, most electrical components are mounted on substrates with high thermal conductivity, such as beryllium oxide or various forms of silica, in order to conduct the heat generated by the electrical components away from the system. However, within a high-temperature environment such as a jet engine, there is a greater amount of heat generated outside the electrical housing than inside. With respect to jet engines, insulation and the use of conventional cooling techniques are typically constrained by specification. Thus, in order to maintain an adequate operating temperature for the electrical components, it is often necessary to mount the electrical housing containing the electrical system components away from the engine systems it is being used to control. This solution, however, creates additional problems associated with the amount of cabling and wiring harnesses required to connect the electrical system to the instrumentation and controls associated with the engine.

Further compounding this problem is the fact that the transfer of heat from the engine does not stop when the engine is not running. After the engine stops, typically shutting down the cooling system for the electrical components, heat from the engine can be transferred to electrical components. This can cause excess thermal cycling of electrical components, such as solder joints for example, leading to premature failure.

Figure 1:
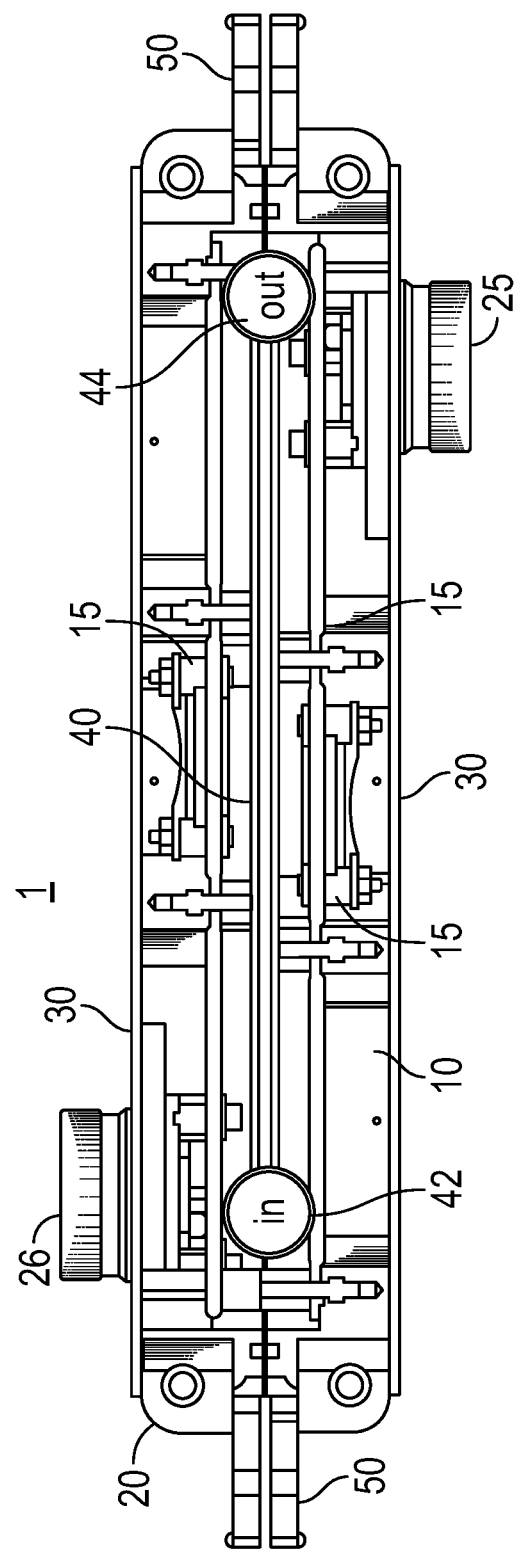
FIG. 1 is a sectioned side view of an electrical chassis according to one embodiment.
Figure 2:
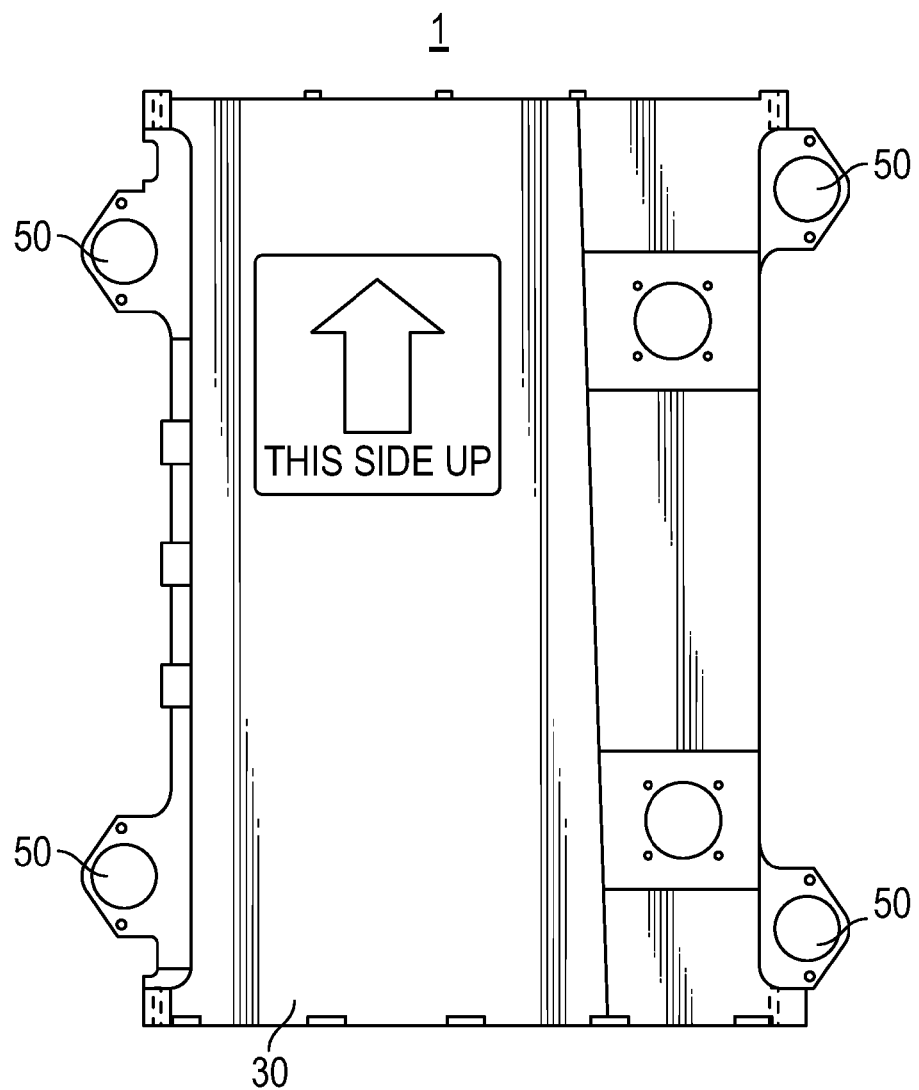
FIG. 2 is a top view of an electrical chassis according to another embodiment.

Disclosed in one embodiment herein is an electrical chassis and electrical system for high-temperature environments that may withstand external heat and maintain an acceptable operating temperature. Referring to FIGS. 1 and 2, the electrical chassis 1 comprises a substrate 10 having a plurality of electrical components 15 arranged therewith. The substrate 10 may be contained within a housing 20. The housing 20 may have connection ports 25, 26 for connecting the electrical components of the system with an external system or with instruments and control elements employed by the system. The housing 20 may be covered, at least partially, by a reflective layer 30. As shown in FIG. 2, this reflective layer 30 may be used to substantially cover all portions of the housing 20 or substrate 10, or those portions that will be oriented towards a heat source. The electrical chassis 1 may further comprise a heat sink 40, which may, in turn, be connected to an inlet 42 and an outlet 44, wherein the heat sink 40 of the chassis 1 is cooled by a fluid such as air, water, or a refrigerant. The electrical chassis 1 may further comprise one or more support features 50 for coupling the electrical chassis 1 to a structure.

In one embodiment, the material forming the substrate 10 exhibits low thermal conductivity. As with conventional substrate materials, the substrate material chosen may also have low electrical conductivity. According to one embodiment, the substrate material is a polymer that is thermally resilient at the expected operating temperature. Other examples of materials that may be appropriate include ceramics with comparatively low thermal conductivity, such as fused silica and aluminum oxide. As shown in FIG. 1, the electrical components 15 may be enclosed within the substrate 10. Thus, the low thermal conductivity of the substrate 10 serves to partially insulate the electrical components 15 from the heat of the surrounding environment. This allows any further cooling features, such as the heat sink 40 adjacent to inlet 40 and outlet 42, to be focused on removing the heat generated by the electrical components themselves. In one embodiment, the inherent insulation provided by the substrate 10 may aid in protecting the electrical components 15 from thermal cycling after the engine has stopped running.

As discussed herein, the term "low thermal conductivity" is construed as a low thermal conductivity when compared to conventional substrate materials. Conventional substrate materials, such as aluminum or beryllium oxide, have thermal conductivity values of about 115 BTU·ft/(hr·ft$^2$·° F.) or greater. The materials identified by this disclosure as having low thermal conductivity have thermal conductivity values that are less than half that value. For example, aluminum oxides have a thermal conductivity value of about 23 BTU·ft/(hr·ft$^2$·° F.), while the polymers discussed herein typically have values of less than 1 BTU·ft/(hr·ft$^2$·° F.).

Some examples of polymers that may be appropriate for some high-temperature environments include polyetheretherketone, polyaryletherketone, polyetherimide, polyetherketoneketone, and polyamideimide. These polymers are generally semi-crystalline thermoplastics and are stable at relatively high temperatures, having a higher glass transition temperature and melting point than most other polymers. Other materials, including infused polymers, polymer composites and some ceramics may also appropriate for the substrate disclosed herein, as will be apparent to one with skill in the art.

In some embodiments, the substrate 10 of the present disclosure may be enclosed within a housing 20. The housing 20 may be comprised of a lightweight, high strength material, such as a carbon composite. In other examples, the housing and the substrate may be formed as a unitary structure from the same substance. The housing 20, or the substrate 10 as the case may be, can be formed having support structures 50 like the apertures shown in order to attach the housing 20 to a structure. The attachment may employ fasteners, adhesives, pressure fitting, or any other device or method to attach the electrical chassis 1 to a structure as needed.

The outer surface of the electrical chassis 1 may be covered, in part or in whole, by a reflective layer 30. The reflective layer 30 may help insulate the electrical chassis 1 from heat that may be radiated from a particular heat source such as, for example, a combustion chamber. The reflective layer 30 may be formed on all sides of the chassis 1 in one embodiment. In some cases, the reflective layer 30 may be disposed on a part of the outer surface, such as on a surface facing the radiating heat source. Where used in a jet aircraft engine, for example, the reflective layer will continue to protect the electronics from heat transfer after the engine has stopped running.

The reflective layer 30 may be comprised of any material that reflects light or heat, or both, and which can withstand the high temperatures of the environment. Further, the reflective layer may comprise a conductive material wherein the reflective layer comprises a faraday shield. Some examples of materials that may be used to form the material of the reflective layer 30 are copper and nickel and their alloys. Other suitable materials will be apparent to those in the art. The reflecting layer 30 may be deposited on the outer surface of the housing by any method that is suitable for the chosen materials, including the housing 20 or substrate 10. This includes spraying, vapor deposition, thin film adhesives, and the like.

The electrical chassis 1 of the present disclosure may be equipped with a heat sink 40 internal to the housing 20 or substrate 10. The heat sink 40 may counteract the heat generated by the electrical components 15. In the illustrated embodiment of FIG. 1, the heat sink 40 is disposed in the center of the housing 20, between the top half (channel A) and the bottom half (channel B). The heat sink 40 may be formed of any material that is typically used for such features, including metallic and ceramic materials. These materials, unlike the substrate material, have high thermal conductivity characteristics.

The heat sink 40 may be arranged in connection with an inlet 42 and an outlet 44. The inlet 42 and outlet 44 allow a fluid to enter and exit the electrical chassis 1 to remove the heat collected by the heat sink 40 from the electrical components 15. The fluid may be air, water, a refrigerant, or any other available fluid. The size and configuration of the heat sink 40 and the fluid channel(s) connecting the inlet 44 and outlet 44 are numerous as will be apparent. Where used in a jet aircraft engine, the fluid may be circulated through the fluid channel(s) for a selected time period after the engine has stopped or until an acceptable temperature has been reached.

The electrical components 15 arranged on the electrical chassis 1 may be chosen for a particular situation. The shape and size of the chassis 1 are not limited by the disclosure. For example, the components 15 may include processors, memory devices, transmitters, etc. The substrate 10 may be used to house a circuit board, or alternatively, the circuits may be disposed on the substrate of the chassis 1.

The electrical chassis 1 may be employed as part of an electrical system, attached to another electrical system, or as a stand-alone device. The electrical components may include a transmitter for connecting the chassis 1 and/or the electrical system may be physically wired to the chassis. The connection ports 25 and 26 in the housing 20 may be used to connect the electrical chassis 1 to an electrical system and/or to connect the electrical components 15 within the chassis to instrumentation and devices for monitoring the environment and/or executing commands, e.g., from a processor.

Figure 3:
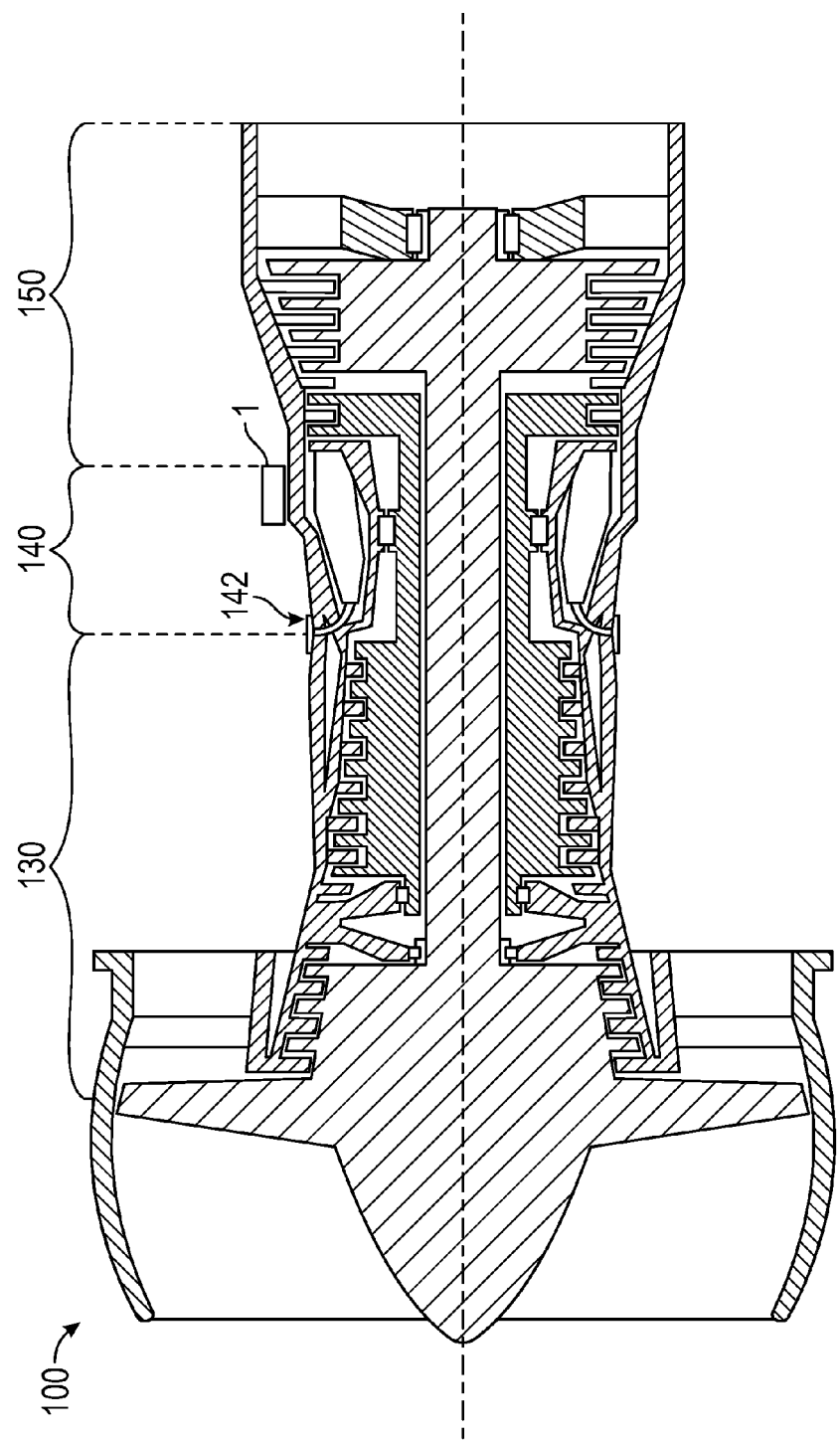
FIG. 3 is a sectioned side view of an electrical chassis arranged with a jet engine, according to another embodiment.

The electrical chassis 1 may be employed as part of a larger system. FIG. 3 illustrates the electrical chassis 1 as part of an aircraft jet engine 100. In the illustrated embodiment, the different sections of the engine are illustrated, including a compression section 130, a combustion section 140, and an expansion section 150. The temperatures of the engine 100 are most extreme in the combustion section 140 and the expansion section 150. In this example, the electrical chassis 1 is located adjacent to the combustion section 140. This location allows the electrical system for the engine 100 to be assembled with minimal cabling and wire harnesses. For example, the location of the electrical chassis 1 as shown is proximal to devices that may require control, such as fuel injector 142. Other locations may be more or less appropriate for a given configuration, but the present disclosure allows for a functional cooling of the electrical components while minimizing other unwanted features that take up space and increase the weight of the system.

In some embodiments, the electrical system of the present disclosure may comprise a full authority digital engine control (FADEC) system. The chassis 1 of the present disclosure allows a FADEC system to be centralized and simplified, with less concern for thermal cycling and other heat related issues.

The FADEC system controls the various functions of the engine to maximize the efficiency in a given condition. As will be apparent, this requires the FADEC system to monitor numerous inputs and control numerous devices. A FADEC system typically includes a central processor for processing the data and initiating commands.

In operation, embodiments of the electrical chassis 1 of the present disclosure may provide advantages over conventional units. For example, an electrical chassis may be constructed using a polyetheretherketone substrate within a housing, a reflective layer disposed thereon. When compared to a conventional aluminum chassis, without the use of convection or conduction cooling, as the case may be when the engines are stopped, the example chassis may be expected to exhibit a thermal conductivity that is approximately 500 times smaller.

While the invention has been described with reference to an exemplary embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Also, in the drawings and the description, there have been disclosed exemplary embodiments of the invention and, although specific terms may have been employed, they are unless otherwise stated used in a generic and descriptive sense only and not for purposes of limitation, the scope of the invention therefore not being so limited. Moreover, the use of the terms first, second, etc., do not denote any order or importance, but rather the terms first, second, etc. are used to distinguish one element from another. Furthermore, the use of the terms a, an, etc. do not denote a limitation of quantity, but rather denote the presence of at least one of the referenced item.

The invention claimed is:

1. An electrical system for use in a high-temperature environment, comprising:
   a housing;
   a substrate disposed in the housing formed of a substrate material, the substrate material having a low thermal conductivity, the substrate material being one or: a polyaryletherketone; and a material containing aluminum oxide and fused silica;
   a plurality of electrical components disposed on the substrate; and
   a reflective layer disposed on at least a portion of an outer surface of the housing.

2. The electrical system of claim 1, further comprising a heat sink coupled to the substrate, the heat sink being cooled by a fluid.

3. The electrical system of claim 1, further comprising at least one opening in the housing for connecting the system to an external system.

4. The electrical system of claim 1, the reflective layer comprising one or more of copper plating and nickel plating, wherein the reflective layer is a faraday shield.

5. The electrical system of claim 1, the housing coupled to a structure.

6. The electrical system of claim 5, wherein the structure is a jet engine.

7. An electrical chassis disposed in an aircraft engine, comprising:
   a substrate having a plurality of electrical components disposed thereon, the substrate being formed from a thermally resistant polymer material, the substrate being arranged in or adjacent to the engine, the polymer material being an infused polymer material or containing polyether ether ketone; and
   a heat sink being coupled to the substrate, the heat sink being cooled by a fluid.

8. The electrical chassis of claim 7, further comprising:
   a housing at least partially surrounding the substrate; and
   a reflective layer disposed on an outer surface of the housing.

9. The electrical chassis of claim 7, wherein the plurality of electrical components includes a full authority digital engine control system.

10. The electrical chassis of claim 7, the substrate being operatively arranged to minimize an amount of cabling associated therewith.

* * * * *